United States Patent [19]

Woolling, Jr.

[11] 4,023,105
[45] May 10, 1977

[54] COUNTER TYPE REMOTE CONTROL RECEIVER PRODUCING BINARY OUTPUTS CORRELATED WITH NUMERICAL COMMANDS OF A COMPANION REMOTE CONTROL TRANSMITTER

[75] Inventor: Kenneth Rau Woolling, Jr., Indianapolis, Ind.

[73] Assignee: RCA Corporation, New York, N.Y.

[22] Filed: Aug. 25, 1975

[21] Appl. No.: 607,699

[52] U.S. Cl. .............................. 325/390; 325/391; 340/168 R
[51] Int. Cl.² .......................................... H04B 1/06
[58] Field of Search ................. 325/390, 391, 392; 340/168 R, 168 B, 168 C, 168 CC, 146.1 BA, 171 R, 171 A; 178/DIG. 15

[56] References Cited

UNITED STATES PATENTS

| | | | |
|---|---|---|---|
| 3,027,497 | 3/1962 | Carlson | 325/392 |
| 3,678,392 | 7/1972 | Houghton | 178/DIG. 15 |
| 3,748,645 | 7/1973 | Kawashima | 340/168 R |
| 3,757,303 | 9/1973 | Blass | 340/171 R |
| 3,936,801 | 2/1976 | Shuman | 340/168 R |

Primary Examiner—Benedict V. Safourek
Assistant Examiner—Michael A. Masinick
Attorney, Agent, or Firm—Eugene M. Whitacre; Peter M. Emanuel

[57] ABSTRACT

A remote control receiver for processing signals representative of a desired television channel number, each channel number being identified by a control signal lying in a respective band of frequencies. The channel number representative control signals are supplied to a multi-stage counter which is also supplied with regularly recurring timing or clock signals. The clock signals determine counting intervals during which the number of cycles of the received control signal are counted. The counter is arranged to provide frequency divided output signals having binary digits which correspond to a binary coded representation of the channel number.

10 Claims, 3 Drawing Figures

Fig. 3

COUNTER TYPE REMOTE CONTROL RECEIVER PRODUCING BINARY OUTPUTS CORRELATED WITH NUMERICAL COMMANDS OF A COMPANION REMOTE CONTROL TRANSMITTER

This invention relates to a remote control receiver employing a counter for identification of received commands and, more particularly, to a remote control receiver of this type producing binary digits from the counter which are binary coded representations of the numerical channel commands of a companion remote control transmitter.

Ultrasonic remote control systems are known in which a plurality of continuous wave (c.w.) signals are generated, the frequency of each signal being uniquely associated with a different function to be controlled. These systems have been employed, for example, in color television receivers where funcctions such as color, tint, volume and channel selection are to be controlled. In that environment, it has been customary to employ inductance -capacitance tuned circuits to separate and identify the individual command frequencies. Such systems require individual alignment of the tuned circuits and are significantly limited in the selectivity which may be realized at reasonable cost. Recently, remote control receivers have been proposed which employ digital techniques to count the cycles of ultrasonic signal received during a predetermined timing period or "window" and thereby identify the transmitted frequency and the function to be controlled. Certain aspects of one such system are described in an article which appeared in the German language magazine, Funkschau, Vol. 23/24, 1972, "Ein Farbfernehgeraet ohne Bedienungsknoepfe," by B. Viereck, P. Wahl and H. Leuschner. In such systems, the information in a frequency decoding counter at the end of a timing period determines the function to be controlled such as volume "up", volume "down", color "up", color "down", tint "plus", tint "minus", tens digit of channel number and units digit of channel number.

In the design of such a system, the spacing between signal frequencies must be sufficient to permit unambiguous discrimination of each frequency and, at the same time, the system must provide rejection of unwanted noise. Furthermore, the spectrum of ultrasonic frequencies available for such a system preferably is selected with a lower limit higher than the second harmonic of the television line scanning frequency in order to avoid spurious triggering of the remote control system by radiation from the line scanning components. Frequencies in the vicinity of the third harmonic of the line scanning frequency also should be avoided for the same reason.

Even with the aforementioned constraints, various frequency decoding counter systems may be designed to identify the frequencies assigned to the channel number digits and other functions to be controlled. In order to reduce the complexity of the overall decoding system, it has been found to be advantageous to provide a counter system in which the binary digit output of the counter itself corresponds to a binary coded representation (either a complement or the direct binary representation) of the selected channel number.

In accordance with the present invention, a remote control receiver is employed for processing signals representative of a plurality of numerical commands. Each numerical command is identified by control signals lying in a respective band of frequencies. Means are provided for supplying timing reference signals recurring at predetermined time intervals. Counter means are responsive to the timing reference signals and to the cotrol signals for providing output signals having binary digits which correspond to a binary coded representation (either direct or a complement) of the channel number.

The invention will be further understood from the following description when considered in conjunction with the accompanying drawings, in which:

FIG. 3 is a chart illustrating frequencies to which the remote control systems of FIGS. 1 and 2 are responsive andd the corresponding binary digits produced by the frequency decoding counter system under various reset control conditions.

Figure 1:
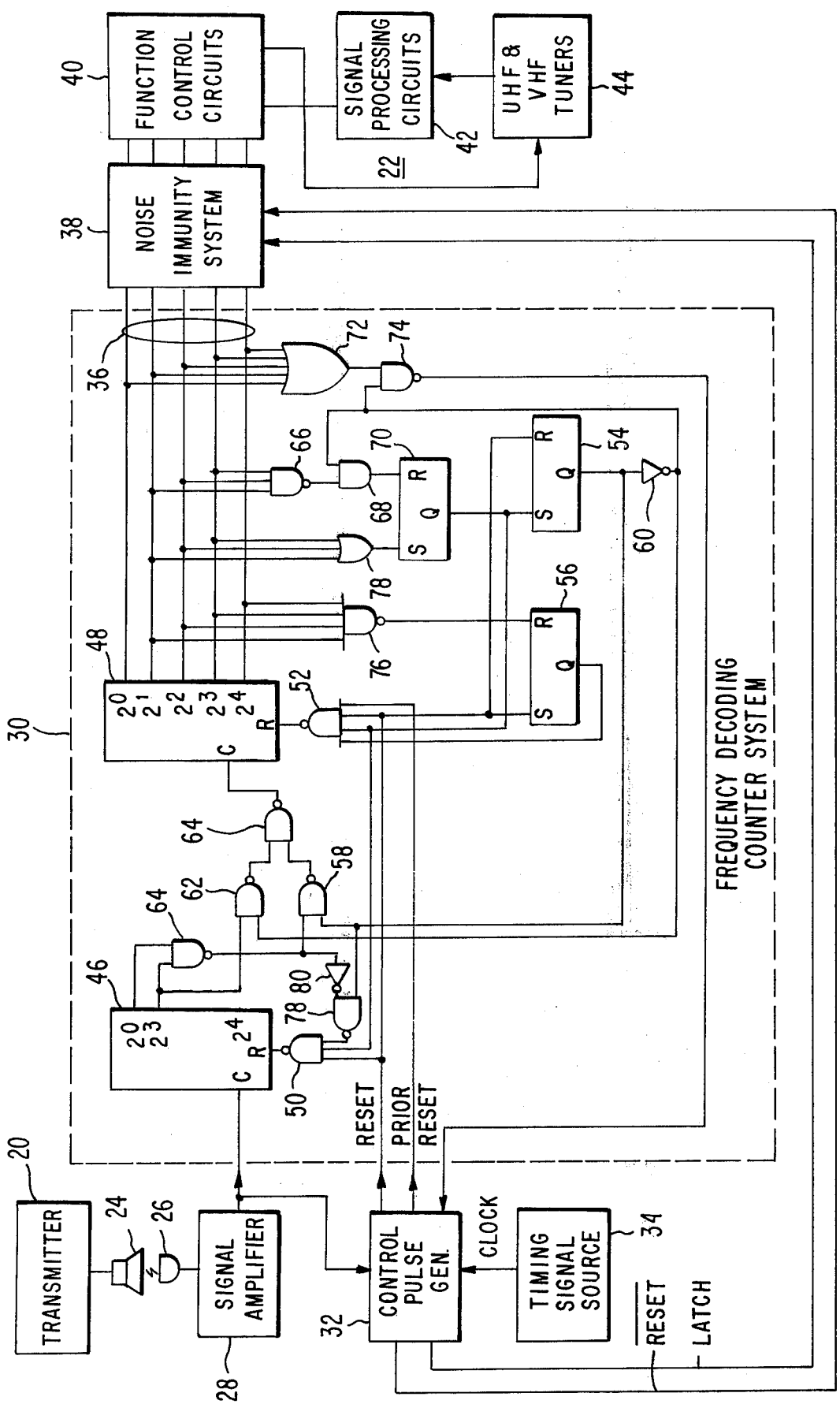
FIG. 1 is a block diagram of a remote control receiver embodying the invention and suitable for use n a television receiver.

In the system of FIG. 1, the operator of a multi-frequency c.w. ultrasonic transmitter 20 selects a frequency to be transmitted which corresponds to a function to be controlled in an associated television receiver 22. Typical frequencies may be in the range of 25,000 to 50,000 Hertz and may be spaced within this band at intervals of, for example, 1080 Hertz (the power line frequency of 60 Hertz multiplied by 18). A frequency is selected, for example, by actuating a push button labelled with the appropriate channel number digit (or other function). Ultrasonic waves are generated at a transmitter transducer 24 and are received by a receiver transducer 26. The received waves are converted to electrical signals which, in turn, are coupled via a broadband signal amplifier 28 to a counter-type frequency decoder 30 which is arranged to provide an effective frequency division and other appropriate modification of the incoming signals, as will be explained below. Counter system 30 is also supplied from the combination of a timing signal source 34 and a control pulse generator 32 with clock or timing pulses at a regular rate (e.g., 60 Hertz derived from the A.C. power line or a crystal reference). The timing pulses determine data counting intervals. Counter system 30 providdes binary outputs on five lines 36 representative of the frequency of the received signal, the output lines 36 all being reset prior to the beginning of each counting interval by means of RESET pulses supplied from ccontrol pulse generator 32. The frequency divided data provided on lines 36 at the end of each counting interval is coupled to a noise immunity system 38 arranged to insure the reliability of received control data before coupling such control data to function control circuits 40 within receiver 22. A suitable noise immunity is system is in my concurrently filed U.S. patent application Ser. No. 607,700 entitled, "COUNTER TYPE REMOTE CONTROL RECEIVER INCLUDING NOISE IMMUNITY SYSTEM."

As is described in that application, the noise immunity system 38 provides for coupling of the data at ddata lines 36 to function control circuits 40 after a predetermined number of consecutive timing periods in which like data is produced at data lines 36 and for decoupling the accepted data when the data at data lines 36 deviates from the accepted data for a predetermined interval. "LATCH" pulses and inverted "RESET" pulses produced by control pulse generator 32 also are couupled to the noise immunity system 38. The LATCH pulses and the inverted RESET pulses provide for the above-described operation of coupling and decoupling data to the function control circuits 40 as is described in the above-referenced application.

Data coupled to the function control circuits 40 produces control signals which are coupled to signal processing circuits 42 and/or to UHF and VHF tuners 44 depending on the category of data (analog functions or channel numbers).

Data at data lines 36 may be, for example, in the formm of separate digits of a channel to be received by the television receiver 22. Thus, when selecting a channel such as channel 12, the transmitter 20 will be activated initially to produce data at data lines 36 corresponding to the tens digit 1 and upon a subsequent transmission will produce data at data lines 36 corresponding to the units digit 2. Such data is coupled to the tuners 44 to cause receiver 22 to receive the corresponding program information. The analog function control signals continuously modify the appropriate function in signal processing circuiits 42 throughout the time that analog function control data is present at data lines 36.

In order to avoid the need for additional decoding when the data at data terminals 36 is representative of channel numbers, the frequency decoding counter system 30 is arranged to produce either a direct binary representation corresponding to the channel number (i.e., a channel 8 command represented by the binary digits 1000) or the complement representation of that channel number (i.e., 0111). In the system of FIG. 1, the counter system 30 includes a first multistage counter 46 and a second multi-stage counter 48. These counters are arranged so that upon initial reception of ultrasonic signals, the first counter 46 is utilized, for example, as a divide-by-16 counter and advances the count of the second counter 48 every 16N cycles (where N is an integer) of the received signal. When second counter 48 attains a predetermined count (as will be specified below), first counter 46 and second counter 48 each are reset to zero and the frequency decoder 30 switches to a secod mode of operation. In the second mode of operation, the first counter 46 functions, for example, as a divide-by-9 counter, thereby advancing the count of second counter 48 every 9 cycles of the received signal. If second counter 48 does not attain the predetermined count required to place the frequency decoding system 30 in the second mode of operation during any one counting interval, second counter 48 is again reset to provide all logic 0's at data terminals 36. This condition indicates the receive frequency is less than a lower limit data frequency. If the count of second counter 48 exceeds a predetermined high count (data frequency) limit, second counter 48 also is reset to zero prior to the end of the counting interval.

Furthermore, the sequence of output counts provided from second counter 48 between the low and high frequency limits is arranged so that, for reception of frequencies corresponding to channel number commands, the output of second counter 48 will be a binary number which corresponds to the complement of the channel number.

The high and low frequency limit operation and the complementary binary representation of channel number commands are provided in the following manner. During each data counting interval (e.g., a duration of 1/120th second) a sequence of a relatively short duration (25 to 50 microseconds), LATCH pulse and a similarly short RESET pulse is provided by control pulse generator 32. The RESET pulse causes the first counter 46 to be reset to an all zero output state via a NAND gate 50 while the second counter 48 is similarly reset to an all zero output state via a NAND gate 52. The RESET pulse also causes a low frequency limit detecting RS bistable circuit 54 to be reset to provide a logic zero at its Q output terminal and a high frequency limit detecting RS bistable circuit 56 to be set to provide a logic one at its Q output terminal. The Q output of low limit circuit 54 is coupled directly to one input of a first mode switching NAND gate 58 and is coupled via an inverter 60 to a first input of a second mode switching NAND gate 62. The outputs of NAND gate 58 and 62 are coupled to a third NAND gate 64, the output of which is coupled to a count (C) terminal of second counter 48. A second input of NAND gate 62 is coupled to a $2^3(8)$ stage of counter 46 while a second input of NAND gate 58 is coupled via a further NAND gate 64 to the $2^0$ and $2^3$ stages of counter 46. In the initial state following the RESET pulse, NAND gate 62 serves to couple counters 46 and 48 in a modified divide-by-16 configuration. That is, the seventeenth pulse counted by first counter 46 and every sixteenth pulse counted thereafter causes second counter 48 to advance one count. Thus, when an ultrasonic continuous wave signal is received at counter system 30, the output count from counter 46 during the first operating mode will be equal to the frequency ($f$) divided by the measuring time (e.g., 1/120th second). In the specified case, a frequency of 27000 Hertz would therefore produce a count in binary form equal to the decimal valve 225. Second counter 48 will therefore provide an output count in binary form equal to the decimal value 14[(225-1)/16]. This condition is sensed by a NAND gate 66 having inputs coupled to the $2^1$, $2^2$ and $2^3$ outputs of second counter 48. The output of NAND gate 66 is coupled to one input of an AND gate 68, a second input of which is coupled to inverter 60 to sense that the system is in the first operating mode (divide-by-16). AND gate 68 is coupled to a reset (R) input of mode switching RS bistable circuit 70, the Q output of which is coupled to low limit bistable circuit 54 and to counter reset NAND gates 50 and 52. When the count 1110 (14) is sensed by NAND gate 66, the Q output of mode switching RS circuit 70 changes to a logic zero, the counters 46 and 48 are reset to all zeroes, and the Q output of low limit RS circuit 54 is changed to a logic 1. NAND gate 62 is therefore disabled and NAND gate 58 is enabled to convert counters 46 and 48 to a divide-by-nine configuration for the remainder of the countinng interval (i.e., until the next RESET pulse).

Thus, it can be seen that the output count of second counter 48 will advance one count for each 1080 Hertz increment (9 × 120) of the received signal above the lower limit of 27000 Hertz.

Figure 3:
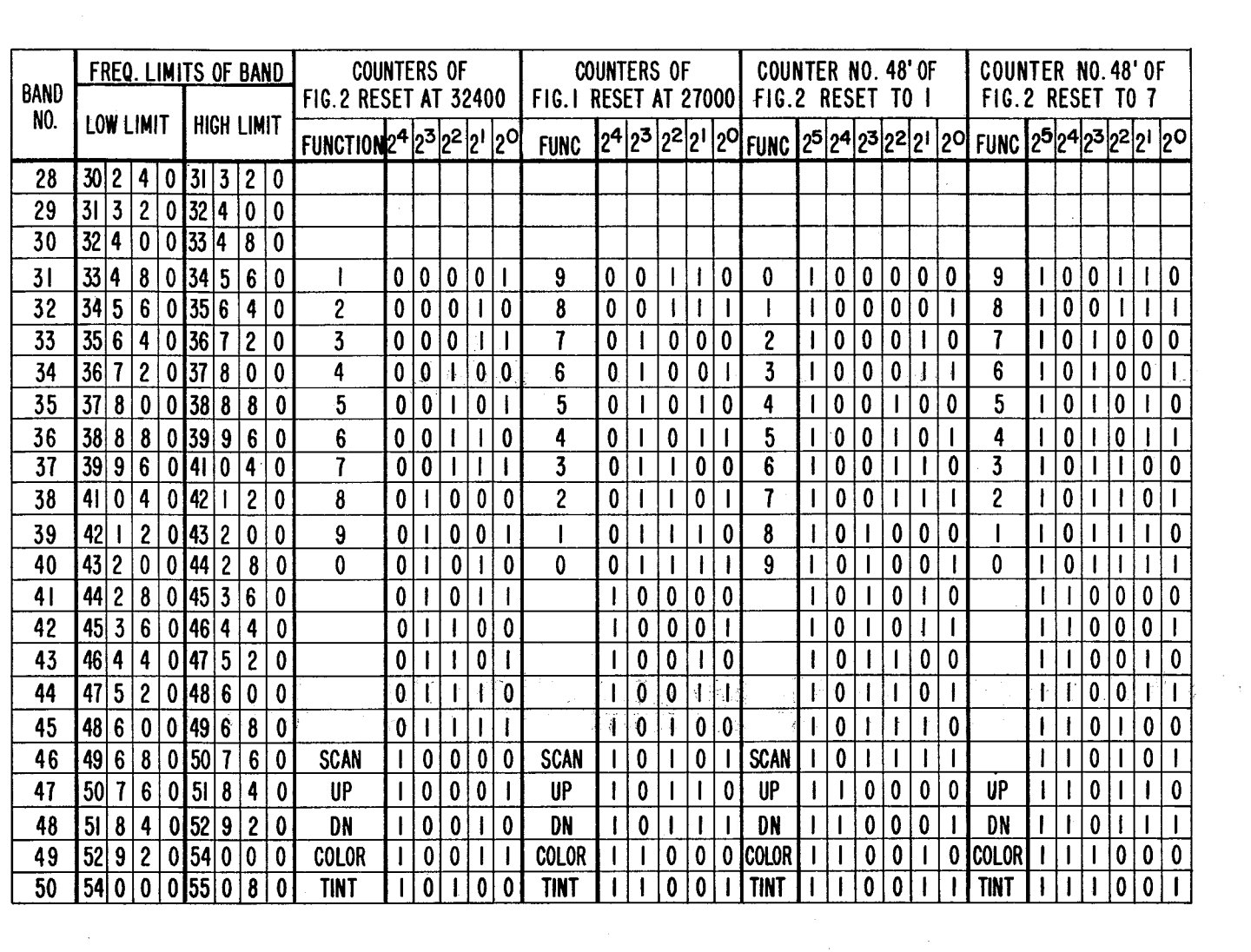

Referring to FIG. 3, the binary state of the counter 48 for various transmitted frequencies is listed in the column under the headinng "Counters of FIG. 1 Reset at 27000". Thus, for example, for a received frequency between 33,480 and 34,560 Hertz (the 31st and 32nd harmonics of 1080 Hertz), the output of counter 48 will indicate 00110 (most significant digit to the left). As indicated in the associated column labelled "Function", this binary output has been selected to represent the channel command "9". Inspection of the decimal channel command numbers and the associated binary outputs of counter 48 will demonstrate that the two are related in that the binary representations correspond to the complement of the associated decimal digit. The direct (non-complement) binary representation of each channel command digit may be provided, if desired, simply by inverting all of the outputs of counter 48.

As noted previously, the assigned data frequencies shown in FIG. 3 for channel number and for analog control functions (scan, color, tint, up, down) are selected to avoid frequencies in the vicinity of the second and third harmonics of the television line scanning frequency. It should also be noted that in substantially all of the illustrated frequency assignments, the fifth bit for channel number commands is different from that for analog functions (the exception being in the case of the SCAN function associated with a "Reset to 1" arrangement to be described below). As such, the fifth bit may be utilized to route the data appropriately to analog or digital control functions.

Referring back to FIG. 1, just prior to the next RESET pulse, a LATCH pulse is developed by control pulse generator 32. If the low frequency limit (27000 Hertz) has not been reached, the output of inverting amplifier 60 will still be at a logic one, which output is coupled to one input of a NAND gate 74. An OR gate 72 coupled to data lines 36 senses the presence of non-zero data and couples such information to the NAND gate 74. A resulting logic zero output is coupled to control pulse generator 32 to permit the LATCH pulse (inverted) to be applied as a PRIOR RESET to counter 48. This resets data lines 36 to zero and thereby causes all zeroes to be transferred to noise immunity system 38 at the end of the LATCH pulse in the manner explained in my above-referenced application.

If the low frequency limit has been reached durng the counting interval, no PRIOR RESET is produced and the LATCH pulse transfers data from data terminals 36 to noise immunity system 38. In either case, the following RESET pulse re-establishes counters 46, 48 and the RS bistable circuits in their initial conditions.

If the incoming data represents a frequency greater than a high frequency limit, all inputs of a NAND gate 76 will be at logic one. High limit RS circuit 56 will change state and reset second counter 48 to all zeroes. In the arrangement shown, the high frequency limit is selected at 59,400 Hertz (low frequency limit of 27000 Hertz plus 30 times 1080).

It should be recognized that additional frequency allocations and counting arrangements may be devised to cause the output of second counter 48 to produce direct or complementary binary representations of channel number commands.

Figure 2:
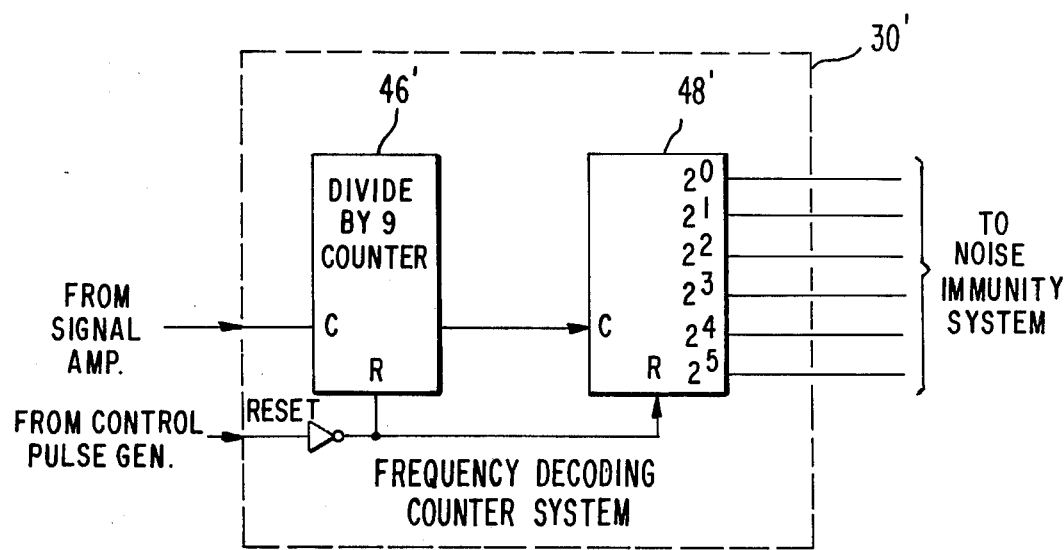
FIG. 2 illustrates a second type of frequency decoding counter system useful in the system of FIG. 1.

Referring to FIG. 2, a simplified diagram of a two stage counter 46', 48' arranged in a divide-by-9 configuration is shown. The first stage 46' would then be arranged, for example, in the manner illustrated for the second operating mode of counter 46 described above. Such a divide-by-9 counter would include internal reset gating such as that illustrated by NAND gate 64, inverter 80 and appropriately simplified coupling circuits to reset counter 46' to zero following each nine counts. Since the divide mode of counters 46', 48' does not change, the output count of second counter 48' would, absent any modifications, be related to the received frequency by the factor 1080 (9 × 120).

In order to provide the desired direct or complementary representation of the channel number commands at the output of counter 48', configurations consistent with the headings of the remaining columns shown in FIG. 3 may be utilized. Thus, for example, the counters 46', 48' of FIG. 2 may be reset to zero each time a count corresponding to a frequency of 32,400 Hertz has been reached (e.g., a count of thirty at the output of counter 48' where the counting interval is 1/120th second). In that case, with the illustrated frequency allocations, the binary output of counter 48' will be the direct binary representation of channel command.

An alternative arrangement may be employed in which the second counter 48', instead of being reset to zero after each counting interval, is reset to a different state. This result may readily be accomplished by coupling reset pulses within the counter stages to an opposite side of the stage to reset such stage to one rather than zero. Advantageous arrangements include resetting the second counter 48' to a 1 state in the $2^0$ stage or resetting to a 1 state in the $2^2$, $2^1$ and $2^0$ stages (i.e., reset to 7). Appropriate frequencies, functions and counter states for such configurations are also listed in FIG. 3.

It should be recognized that various other modifications may be made within the scope of the contemplated invention. Numerous types of standard logic elements may be employed for AND, NAND, OR and inverter functions. One type of RS bistable circuit which may be employed is the RCA CD4044 type. A type of counter which also may be employed is the RCA CD4024 type.

What is claimed is:

1. In a remote control receiver for receiving control signals representative of a plurality of numerical quantities, each numerical quantity being identified by control signals lying in a respective band of frequencies, the combination comprising:
   means for supplying timing reference signals recurring at predetermined time intervals; and
   counter means responsive to said timing reference signals and to said control signals for providing binary output signals representing an accumulated count, said counter means including means for offsetting the count represented by said binary output signals in a predetermined manner so that digits thereof correspond to a binary coded representation of each received numerical quantity.

2. In a remote control receiver, the combination according to claim 1 wherein:
   said counter means provides binary output signals of which the four least significant digits correspond directly to the binary coded decimal representation of each received numerical quantity.

3. In a remote control receiver, the combination according to claim 1 wherein:
   said counter means provides binary output signals of which the four least significant digits correspond to the complement of the binary coded decimal representation of each received numerical quantity.

4. In a remote control receiver, the combination according to claim 1 wherein:
   said counter means comprises first and second counters coupled together and means for resetting at least said second counter during each said time interval to offset the output thereof in a predetermined manner to correspond to a binary coded representation of each received numerical quantity.

5. In a remote control receiver, the combination according to claim 4 wherein:
said resetting means is arranged to reset said first and second counters to zero upon counting of a predetermmined lower count limit during each time interval.

6. In a remote control receiver, the combination according to claim 4 wherein:
said resetting means is arranged to reset said second counter to a non-zero condition prior to the start of each time interval.

7. In a remote control receiver, the combination according to claim 6 wherein:
said condition corresponds to a one in the least significant digit position.

8. In a remote control receiver, the combination according to claim 7 wherein:
said counter means provides binary output signals of which the four least significant digits correspond directly to the binary coded decimal representation of the numerical quantity.

9. In a remote control receiver, the combination according to claim 6 wherein:
said condition corresponds to ones in each of the three least significant digit positions.

10. In a remote control receiver, the combination according to claim 9 wherein:
said counter means provides binary output signals of which the four least significant digits correspond to the complement of the binary coded decimal representation of the numerical quantity.

* * * * *

Disclaimer 4,023,105.—*Kenneth Rau Woolling, Jr.*, Indianapolis, Ind. COUNTER TYPE REMOTE CONTROL RECEIVER PRODUCING BINARY OUTPUTS CORRELATED WITH NUMERICAL COMMANDS OF A COMPANION REMOTE CONTROL TRANSMITTER. Patent dated May 10, 1977. Disclaimer filed Aug. 17, 1981, by the assignee, *RCA Corp.*

Hereby enters this disclaimer to claims 1, 2 and 3 of said patent.

[*Official Gazette October 20, 1981.*]